US009899621B2

(12) United States Patent
Wu et al.

(10) Patent No.: US 9,899,621 B2
(45) Date of Patent: Feb. 20, 2018

(54) ORGANIC LIGHT EMITTING DIODE AND DISPLAY DEVICE THEREOF

(71) Applicant: BOE TECHNOLOGY GROUP CO., LTD., Beijing (CN)

(72) Inventors: Chang-Yen Wu, Beijing (CN); Ronggang Shangguan, Beijing (CN); Xiang Wan, Beijing (CN)

(73) Assignee: BOE TECHNOLOGY GROUP CO., LTD., Chaoyang District, Beijing (CN)

(*) Notice: Subject to any disclaimer, the term of this patent is extended or adjusted under 35 U.S.C. 154(b) by 0 days.

(21) Appl. No.: 15/037,881

(22) PCT Filed: Dec. 28, 2015

(86) PCT No.: PCT/CN2015/099126
§ 371 (c)(1),
(2) Date: May 19, 2016

(87) PCT Pub. No.: WO2016/177006
PCT Pub. Date: Nov. 10, 2016

(65) Prior Publication Data
US 2017/0125716 A1 May 4, 2017

(30) Foreign Application Priority Data
May 4, 2015 (CN) .......................... 2015 1 0222251

(51) Int. Cl.
H01L 51/50 (2006.01)
H01L 51/00 (2006.01)

(52) U.S. Cl.
CPC ...... H01L 51/5044 (2013.01); H01L 51/5004 (2013.01); H01L 51/5012 (2013.01); H01L 51/0059 (2013.01); H01L 2251/552 (2013.01)

(58) Field of Classification Search
None
See application file for complete search history.

(56) References Cited

U.S. PATENT DOCUMENTS 5,150,006 A * 9/1992 Van Slyke .............. C07F 5/069
252/301.16
5,405,709 A * 4/1995 Littman ................. C09K 11/06
313/501

(Continued)

FOREIGN PATENT DOCUMENTS

CN 1498049 A 5/2001
CN 101195720 A 6/2008

(Continued)

OTHER PUBLICATIONS

International Search Report & Written Opinion dated Apr. 1, 2016 regarding PCT/CN2015/099126.

(Continued)

Primary Examiner — Michael Lebentritt
Assistant Examiner — Jordan Klein
(74) Attorney, Agent, or Firm — Intellectual Valley Law, P.C.

(57) ABSTRACT

The present application discloses an organic light emitting diode comprising a cathode; an anode; a plurality of light emitting layers connected in series between the cathode and the anode; and a charge generation layer between at least one pair of adjacent light emitting layers. At least one light emitting layer comprises a host layer having charge transport property.

20 Claims, 2 Drawing Sheets

(56) References Cited

U.S. PATENT DOCUMENTS

| | | | | |
|---|---|---|---|---|
| 7,696,681 B2* | 4/2010 | Park | H01L 27/3209 | 313/503 |
| 7,816,859 B2* | 10/2010 | Spindler | C09K 11/06 | 313/504 |
| 7,821,201 B2* | 10/2010 | Hatwar | H01L 27/3209 | 313/504 |
| 8,476,624 B1* | 7/2013 | Wu | H01L 51/5004 | 257/40 |
| 9,105,861 B2* | 8/2015 | Jung | H01L 51/5044 | |
| 2005/0029933 A1* | 2/2005 | Liao | H01L 51/5036 | 313/504 |
| 2006/0040132 A1* | 2/2006 | Liao | H01L 51/5036 | 428/690 |
| 2006/0145604 A1* | 7/2006 | Liao | H01L 51/5052 | 313/506 |
| 2008/0135804 A1* | 6/2008 | Qiu | C09K 11/06 | 252/301.16 |
| 2010/0288362 A1* | 11/2010 | Hatwar | H01L 51/5044 | 136/263 |
| 2012/0098011 A1* | 4/2012 | Choi | H01L 27/3209 | 257/98 |
| 2012/0098012 A1* | 4/2012 | Kim | H01L 27/3209 | 257/98 |
| 2013/0062599 A1* | 3/2013 | Holmes | H01L 51/5008 | 257/40 |
| 2013/0134410 A1* | 5/2013 | Kim | H01L 51/0039 | 257/40 |
| 2013/0146850 A1* | 6/2013 | Pieh | H01L 51/5203 | 257/40 |
| 2013/0153881 A1* | 6/2013 | Tokoo | H01L 51/5096 | 257/40 |
| 2013/0264551 A1* | 10/2013 | Pieh | H01L 51/5056 | 257/40 |
| 2013/0320368 A1* | 12/2013 | Seo | H01L 27/3206 | 257/89 |
| 2014/0061600 A1* | 3/2014 | Kim | H01L 27/3211 | 257/40 |

FOREIGN PATENT DOCUMENTS

| | | |
|---|---|---|
| CN | 101661996 A | 3/2010 |
| CN | 101960632 A | 1/2011 |
| CN | 103165817 A | 6/2013 |
| CN | 104795432 A | 7/2015 |

OTHER PUBLICATIONS

The First Office Action in the Chinese Patent Application No. 201510222251.9, dated Apr. 28, 2017; English translation attached.

* cited by examiner

ORGANIC LIGHT EMITTING DIODE AND DISPLAY DEVICE THEREOF

CROSS-REFERENCE TO RELATED APPLICATION

This application is a national stage application under 35 U.S.C. § 371 of International Application No. PCT/CN2015/099126 filed Dec. 28, 2015, which claims priority to Chinese Patent Application No. 201510222251.9, filed May 4, 2015, the contents of which are incorporated by reference in the entirety.

FIELD

The present invention relates to organic electroluminescence technology, more particularly, to an organic light emitting diode and a display device thereof.

BACKGROUND

An organic light emitting diode (OLED) typically include a cathode and an anode, and light emitting units between the cathode and the anode. An OLED can be a single unit OLED or a tandem OLED. A single unit OLED has only one light emitting unit, which includes a hole injection layer (HIL), a hole transport layer (HTL), an emitting material layer (EML), an electron transport layer (ETL), and an electron injection layer (EIL). A tandem OLED has multiple light emitting units connected in series between the cathode and the anode.

SUMMARY

In one aspect, the present invention provides an organic light emitting diode comprising a cathode; an anode; a plurality of light emitting layers connected in series between the cathode and the anode; and a charge generation layer between at least one pair of adjacent light emitting layers. At least one light emitting layer comprises a host layer having charge transport property.

Optionally, the charge generation layer is adjacent to a hole injection layer of a neighboring light emitting layer.

Optionally, a majority of the host has a charge mobility rate larger than $10^{-4}$ cm$^2$/Vs.

Optionally, the host layer comprises an N-type host.

Optionally, the at least one light emitting layer further comprises a hole transport layer on a side of the host layer distal to the cathode.

Optionally, the host layer is in direct contact with the cathode.

Optionally, the host layer is in direct contact with the charge generation layer.

Optionally, the N-type host has electron transport property, and comprises one or more compounds selected from a group consisting of oxazole derivatives and dendrimers thereof, metal chelates, azole compounds, quinoline derivatives, quinoxaline derivatives, di-aza anthracene derivatives, phenanthroline, heterocyclic silicon compounds, and perfluorinated -s oligomers.

Optionally, the thickness of the host layer is in a range of around 25 nm to around 60 nm.

Optionally, a lowest unoccupied molecular orbital energy level of the N-type host is higher than that of the charge generation layer by a difference within about 0.2 eV.

Optionally, the host layer comprises a P-type host.

Optionally, the at least one light emitting layer further comprises an electron transport layer on a side of the host layer distal to the anode.

Optionally, the at least one light emitting layer further comprises a hole injection layer sandwiched by the host layer and the charge generation layer.

Optionally, the P-type host has hole transport property, and comprises triarylamine or derivatives thereof.

Optionally, the thickness of the host layer is in a range of around 25 nm to around 60 nm.

Optionally, the host layer comprises an N-type host and a P-type host.

Optionally, the host layer is in direct contact with the cathode.

Optionally, the thickness of the host layer is in a range of around 30 nm to around 65 nm.

Optionally, a light emitting layer most proximal to the cathode further comprises an electron injection layer on a side of the light emitting layer proximal to the cathode.

Optionally, a light emitting layer most proximal to the anode further comprises a hole injection layer on a side of the light emitting layer proximal to the anode.

In another aspect, the present invention also provides a display device comprising the organic light emitting diode as described herein.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

Figure 1:
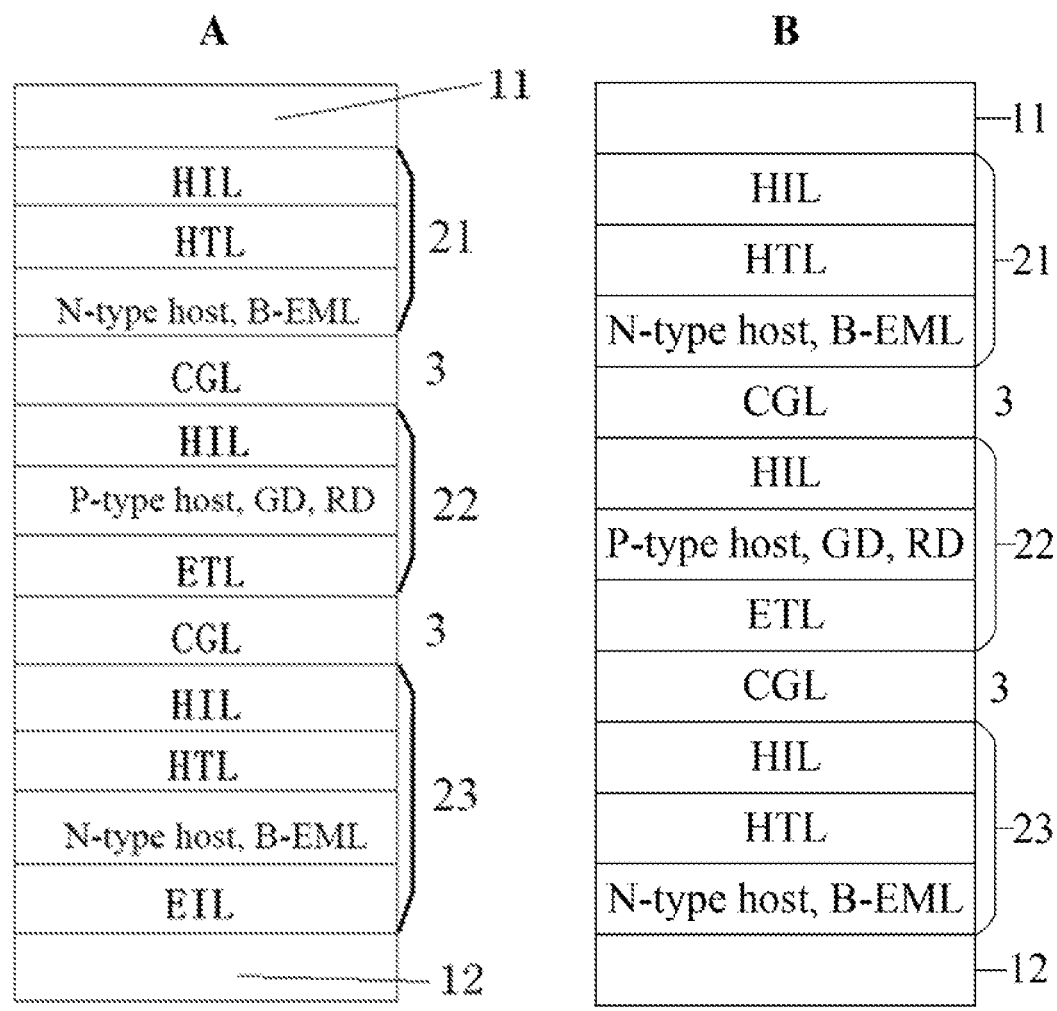
FIGS. 1A and 1B are diagrams illustrating structures of organic light emitting diodes in some embodiments according to the present disclosure.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Typically, multiple light emitting units of a single unit OLED are simply stacked together to make a conventional tandem OLED. A conventional OLED therefore has a complex structure having many layers. The manufacturing process for making such a conventional OLED has strict requirements for equipment, and is costly.

The disclosure in some embodiments provides an organic light emitting diode having a cathode, an anode, and a plurality of light emitting layers connected in series between the cathode and the anode. At least one light emitting layer includes a host layer. Optionally, the organic light emitting diode includes a charge generation layer between at least one pair of adjacent light emitting layers. Optionally, the organic light emitting diode includes a charge generation layer between multiple pairs of adjacent light emitting layers. Optionally, the organic light emitting diode includes a charge generation layer between every pair of adjacent light emitting layers. Optionally, the charge generation layer is adjacent to a hole injection layer of a neighboring light emitting layer.

The host layer has charge transport property, therefore functions as both a charge transport layer and a light emitting layer. Due to the charge transport property of the host layer, the number of independent charge transport layers (e.g., a charge transport layer which is not also an emission layer) in an organic light emitting diode can thus be reduced.

Depending on the types of hosts used, the host layer can have electron transport property or hole transport property, or both. For example, an N-type host layer would possess electron transport property. A P-type host layer would possess hole transport property. A host layer may have both N-type and P-type hosts. Such a host layer would have both electron transport property and hole transport property.

Due to the electron transport property of the N-type host and the hole transport property of the P-type host, the manufacturing process of the organic light emitting diode can be simplified. For example, when an N-type host layer is used, an electron transport layer in the OLED can be eliminated without affecting the properties of the OLED. Similarly, when a P-type host is used, a hole transport layer in the OLED can be eliminated without affecting the properties of the OLED. Moreover, when a host layer containing both an N-type host and a P-type host is used, an electron transport layer and a hole transport layer can both be eliminated without affecting the properties of the OLED.

Various N-type hosts and P-type hosts having charge transport property can be used for making the host layer. Examples of N-type hosts include, but are not limited to, oxazole derivatives and dendrimers thereof; metal chelates, azole compounds, quinoline derivatives, quinoxaline derivatives, di-aza anthracene derivatives, phenanthroline, heterocyclic silicon compounds, and perfluorinated -s oligomers. Examples of P-type hosts include, but are not limited to, triarylamine and derivatives thereof.

Optionally, the hosts have relatively high charge mobility rate, e.g., $>1\times10^{-4}$ cm$^2$/Vs, $5\times10^{-4}$ cm$^2$/Vs or $1\times10^{-3}$ cm$^2$/Vs. Optionally, a majority of the host has a charge mobility rate, e.g., $>1\times10^{-4}$ cm$^2$/Vs, $5\times10^{-4}$ cm$^2$/Vs or $1\times10^{-3}$ cm$^2$/Vs.

Optionally, the thickness of the host layer can be designed to be in the range of around 25 nm to around 60 nm, e.g., around 25 nm to around 30 nm, around 30 nm to around 40 nm, around 40 nm to around 50 nm, or around 50 nm to around 60 nm. Optionally, when the host layer includes both a P-type host and an N-type host, the thickness of the host layer is in the range of around 30 nm to around 65 nm, e.g., around 30 nm to around 40 nm, around 40 nm to around 50 nm, around 50 nm to around 60 nm, or around 60 nm to around 65 nm. Optionally, the lowest unoccupied molecular orbital energy level of the N-type host is higher than that of the charge generation layer. Optionally, the lowest unoccupied molecular orbital energy level of the N-type host is higher than that of the charge generation layer by a difference within about 0.2 eV.

Optionally, when the host layer is an N-type host, the light emitting layer further includes a hole transport layer on a side of the host layer distal to the cathode. For example, in a light emitting layer that is most proximal to the anode and is between the anode and a charge generation layer, the hole transport layer is on a side of the host layer distal to the cathode (e.g., proximal to the anode). In a light emitting layer that is most proximal to the cathode and is between the cathode and a charge generation layer, the hole transport layer is on the side of the host layer distal to the cathode (e.g., proximal to the anode). Similarly, a hole transport layer in a light emitting layer other than those proximal to the cathode and the anode may be on a side of the host layer distal to the cathode.

When an N-type host layer is included in a light emitting layer most proximal to the cathode, the OLED manufacturing process can be further simplified by eliminating a charge generation layer between the cathode and the host layer. Optionally, in a light emitting layer most proximal to the cathode, the host layer is in direct contact with the cathode.

When an N-type host layer is used in a light emitting layer distal to the cathode, the OLED manufacturing process can be further simplified by eliminating an electron transport layer between a charge generation layer and a host layer of a light emitting layer. Optionally, the host layer is in direct contact with the charge generation layer.

Optionally, when the host layer is a P-type host layer, the light emitting layer further includes an electron transport layer on a side of the host layer distal to the anode. For example, in a light emitting layer that is most proximal to the cathode and is between the cathode and a charge generation layer, the electron transport layer is on a side of the host layer distal to the cathode (e.g., proximal to the cathode). In a light emitting layer that is most proximal to the anode and is between the anode and a charge generation layer, the electron transport layer is disposed on the side distal to the anode (e.g., proximal to the cathode). Similarly, an electron transport layer in a light emitting layer other than those proximal to the cathode and the anode may be on a side of the host layer distal to the anode.

Optionally, when the host layer contains a P-type host, the light emitting layer is distant from the anode (e.g., other than the layer most proximal to the anode). Optionally, when the P-type light emitting layer is distant from the anode, the P-type light emitting layer further comprises a hole injection layer sandwiched by the host layer and a charge generation layer.

When the host layer includes both an N-type host and a P-type host, optionally the host layer is in direct contact with the cathode.

In some embodiments, the properties of the OLED) may be further improved by including an electron injection layer in a light emitting layer most proximal to the cathode. The electron injection layer is on a side of the light emitting layer proximal to the cathode. Similarly, the properties of the OLED may be improved by including a hole injection layer in a light emitting layer most proximal to the anode. The hole injection layer is on a side of the light emitting layer proximal to the anode.

The light emitting layer may include light emitting materials of different colors. For example, the host (e.g., an N-type, a P-type, or both) material can be mixed with various light emitting materials of different colors for making the host layer. Optionally, an OLED has two light emitting layers each containing blue light emitting material, and a third light emitting layer containing red and green light emitting materials.

Various appropriate materials may be used for making the charge generation layer. Examples of such materials include, but are not limited to, oxazole derivatives and dendrimers thereof, metal chelates, azole compounds, quinoline derivatives, quinoxaline derivatives, di-aza anthracene derivatives, phenanthroline, heterocyclic silicon compounds, and perfluorinated -s oligomers.

FIGS. 1A and 1B are diagrams illustrating structures of organic light emitting diodes in some embodiments according to the present disclosure. Referring to FIGS. 1A and 1B, the organic light emitting diode in the embodiment includes three light emitting layers. The light emitting layer most proximal to the anode 11 is the first light emitting layer 21. The light emitting layer most proximal to the cathode 12 is the third light emitting layer 23. The light emitting layer in the middle is the second light emitting layer 22. A charge generation layer 3 is disposed between the first light emitting layer 21 and the second light emitting layer 22, and between the second light emitting layer 22 and the third light emitting layer 23. The charge generation layers 3 are adjacent to the hole injection layers in the second light emitting layer 22 and the third light emitting layer 23, respectively.

Referring to FIG. 1A, the first light emitting layer 21 includes three layers: a hole injection layer (HIL), a hole transport layer (HTL), and an N-type host, B-EML layer. The N-type host, B-EML layer is a host layer for emitting blue light. The thickness of the host layer in the embodiment is larger than 25 nm. The second light emitting layer 22 includes three layers: a hole injection layer (HIL), a P-type host, GD, RD layer, and an electron transport (ETL) layer. GD refers to green light emitting material, and RD refers to red light emitting material. The P-type host, GD, RD layer is a host layer containing a P-type host mixed with green light emitting material and red light emitting material. The thickness of the host layer in the embodiment is larger than 25 nm. The third light emitting layer 23 includes four layers: a hole injection layer (HIL), a hole transport layer (HTL), an N-type host, B-EML layer (the host layer), and an electron injection layer (EIL). The thickness of the host layer in the embodiment is larger than 25 nm. Referring to FIG. 1B, the N-type host. B-EML layer (the host layer) in some embodiments is in direct contact with the cathode 12.

Figure 2:
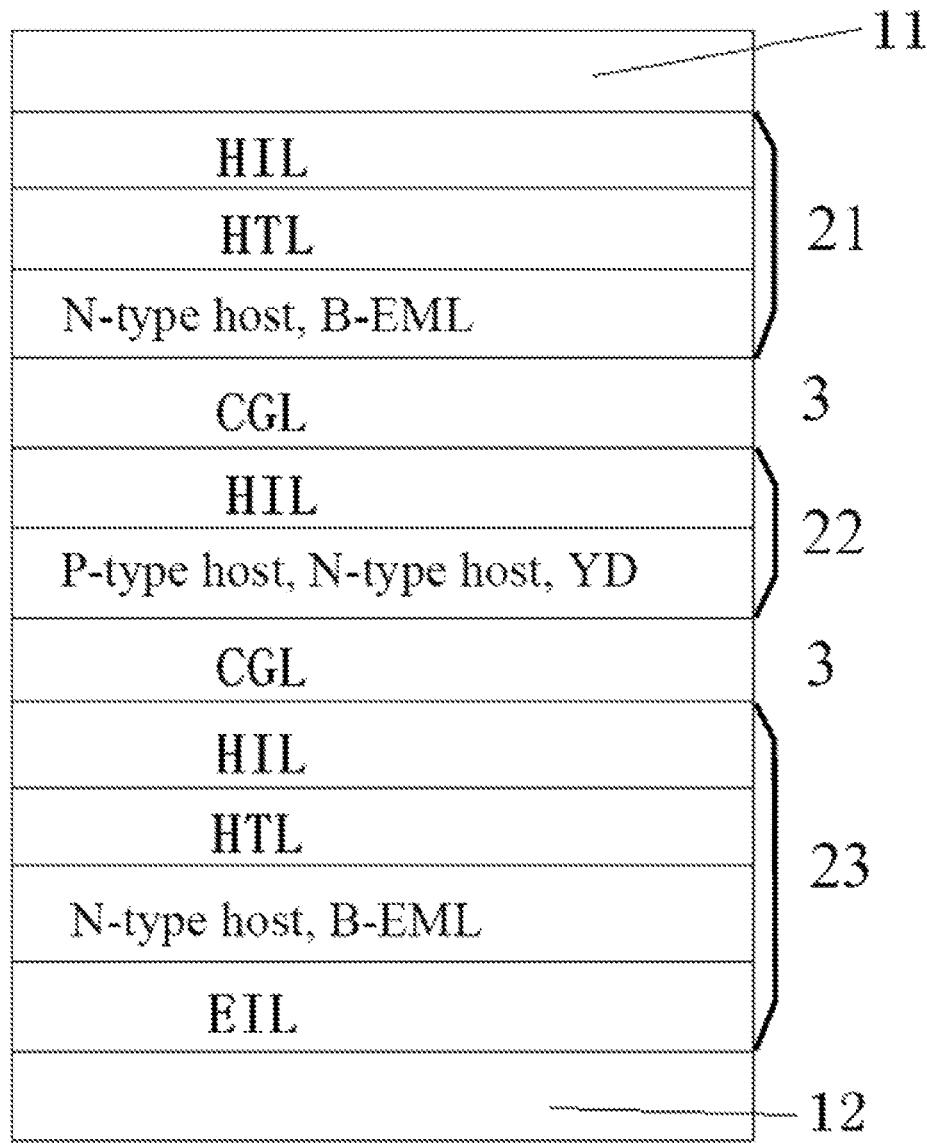
FIG. 2 is a diagram illustrating the structure of an organic light emitting diode in another embodiment.

FIG. 2 is a diagram illustrating the structure of an organic light emitting diode in another embodiment. Referring to FIG. 2, the organic light emitting diode in the embodiment includes three light emitting layers. The light emitting layer most proximal to the anode 11 is the first light emitting layer 21. The light emitting layer most proximal to the cathode 12 is the third light emitting layer 23. The light emitting layer in the middle is the second light emitting layer 22. A charge generation layer 3 is disposed between the first light emitting layer 21 and the second light emitting layer 22, and between the second light emitting layer 22 and the third light emitting layer 23. The charge generation layer 3 is adjacent to a hole injection layer of a neighboring light emitting layer.

Referring to FIG. 2, the first light emitting layer 21 includes three layers: a hole injection layer (HIL), a hole transport layer (HTL), and an N-type host, B-EML layer. The N-type host, B-EML layer is a host layer for emitting blue light. The thickness of the host layer in the embodiment is larger than 25 nm. The second light emitting layer 22 includes two layers: a hole injection layer (HIL), and a P-type, N-type, YD layer. YD refers to yellow light emitting material. The P-type, N-type, YD layer is a host layer containing a P-type host and an N-type host mixed with yellow light emitting material. The thickness of the host layer in the embodiment is larger than 30 nm. The third light emitting layer 23 includes four layers: a hole injection layer (HIL), a hole transport layer (HTL), an N-type host, B-EML layer (the host layer), and an electron injection layer (EIL). The thickness of the host layer in the embodiment is larger than 25 nm.

As compared to conventional organic light emitting diode in which multiple light emitting units of a single unit OLED are simply stacked together, the number of layers in the organic light emitting diodes of FIGS. 1 and 2 are much reduced due to the charge transport property of the host layer.

The organic light emitting diodes are provided in FIGS. 1 and 2 as illustrating examples. Various modifications and similar arrangements can be made based on the detailed description of the disclosure. For example, the organic light emitting diodes may have additional charge transport layers. For example, the number of light emitting layers can be more than three, e.g., 4, 5, 6, 7, 8, 9, 10, 11. Optionally, the number of light emitting layers is less than 15, 14, 13, 12, 11, 10, 9, 8, 7, 6, 5, 4. Optionally, the number of total organic layers in the organic light emitting diode is less than 20, 19, 18, 17, 16, 15, 14, 13, 12, 11, 10.

The present invention also provides a display device having an organic light emitting device as described herein. The display device can be of any suitable type, e.g., an electronic paper display device, an OLED display panel, a mobile phone, an AMOLED display device, an AMOLED television, a laptop, a computer, PDA, GPS, an in-vehicle display device, a projection display, a camera, a video recorder, a digital camera, an electronic watch, a calculator, a meter, a public display, a virtual display, and so on.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An organic light emitting diode, comprising:
   a cathode;
   an anode;
   a plurality of light emitting layers connected in series between the cathode and the anode; and
   a charge generation layer between at least one pair of adjacent light emitting layers;

wherein at least one light emitting layer comprises a host layer comprising a host material mixed with a light emitting material;

the host layer is a dual-function layer having both a charge transport function and a light emitting function; and the host layer is in direct contact with one of the cathode and the charge generation layer.

2. The organic light emitting diode of claim 1, wherein the charge generation layer is adjacent to a hole injection layer of a neighboring light emitting layer.

3. The organic light emitting diode of claim 1, wherein a majority of the host has a charge mobility rate larger than $10^{-4}$ cm$^2$/Vs.

4. The organic light emitting diode of claim 1, wherein the host layer comprises an N-type host.

5. The organic light emitting diode of claim 4, wherein the at least one light emitting layer further comprises a hole transport layer on a side of the host layer distal to the cathode.

6. The organic light emitting diode of claim 4, wherein the host layer is in direct contact with the cathode.

7. The organic light emitting diode of claim 4, wherein the host layer is in direct contact with the charge generation layer.

8. The organic light emitting diode of claim 4, wherein the N-type host has electron transport property, and comprises one or more compounds selected from a group consisting of oxazole derivatives and dendrimers thereof, metal chelates, azole compounds, quinoline derivatives, quinoxaline derivatives, di-aza anthracene derivatives, phenanthroline, heterocyclic silicon compounds, and perfluorinated -s oligomers.

9. The organic light emitting diode of claim 4, wherein the thickness of the host layer is in a range of around 25 nm to around 60 nm.

10. The organic light emitting diode of claim 4, wherein a lowest unoccupied molecular orbital energy level of the N-type host is higher than that of the charge generation layer by a difference within about 0.2 eV.

11. The organic light emitting diode of claim 1, wherein the host layer comprises a P-type host.

12. The organic light emitting diode of claim 11, wherein the at least one light emitting layer further comprises an electron transport layer on a side of the host layer distal to the anode.

13. The organic light emitting diode of claim 11, wherein the at least one light emitting layer further comprises a hole injection layer sandwiched by the host layer and the charge generation layer.

14. The organic light emitting diode of claim 11, wherein the P-type host has hole transport property, and comprises triarylamine or derivatives thereof.

15. The organic light emitting diode of claim 11, wherein the thickness of the host layer is in a range of around 25 nm to around 60 nm.

16. The organic light emitting diode of claim 1, wherein the host layer comprises an N-type host and a P-type host.

17. The organic light emitting diode of claim 16, wherein the host layer is in direct contact with the cathode.

18. The organic light emitting diode of claim 16, wherein the thickness of the host layer is in a range of around 30 nm to around 65 nm.

19. The organic light emitting diode of claim 1, wherein a light emitting layer most proximal to the cathode further comprises an electron injection layer on a side of the light emitting layer proximal to the cathode.

20. The organic light emitting diode of claim 1, wherein a light emitting layer most proximal to the anode further comprises a hole injection layer on a side of the light emitting layer proximal to the anode.

* * * * *